(12) United States Patent
Giraud et al.

(10) Patent No.: US 9,479,168 B2
(45) Date of Patent: Oct. 25, 2016

(54) METHOD FOR CONTROLLING AN INTEGRATED CIRCUIT

(71) Applicants: Commissariat à l'énergie atomique et aux énergies alternatives, Paris (FR); STMicroelectronics SA, Montrouge (FR); STMicroelectronics (Crolles 2) SAS, Crolles (FR)

(72) Inventors: Bastien Giraud, Voreppe (FR); Fady Abouzeid, Grenoble (FR); Sylvain Clerc, Grenoble (FR); Jean-Philippe Noel, Montbonnot Saint Martin (FR); Philippe Roche, Biviers (FR); Yvain Thonnart, Grenoble (FR)

(73) Assignees: Commissariat à l'énergie atomique et aux énergies alternatives, Paris (FR); STMicroelectronics SA, Montrouge (FR); STMicroelectronics (Crolles 2) SAS, Crolles (FR)

(*) Notice: Subject to any disclaimer, the term of this patent is extended or adjusted under 35 U.S.C. 154(b) by 57 days.

(21) Appl. No.: 14/225,520

(22) Filed: Mar. 26, 2014

(65) Prior Publication Data

US 2014/0292374 A1    Oct. 2, 2014

(30) Foreign Application Priority Data

Mar. 26, 2013 (FR) ...................... 13 52849

(51) Int. Cl.
*H03K 19/096* (2006.01)
*H03K 19/00* (2006.01)
(Continued)

(52) U.S. Cl.
CPC ....... *H03K 19/0016* (2013.01); *H01L 27/0928* (2013.01); *H01L 27/11807* (2013.01);
(Continued)

(58) Field of Classification Search
CPC ............... H03K 19/096; H03K 2005/00136; H03K 19/0013; H03K 19/00323; H03K 19/00315; H03K 19/1774
USPC .......... 257/351, E27.062, E27.064, E21.561, 257/E21.611, E21.632; 438/154, 199; 326/81–83, 86–87, 93, 98, 104, 108, 326/103
See application file for complete search history.

(56) References Cited

U.S. PATENT DOCUMENTS 5,610,533 A    3/1997  Arimoto et al.
5,936,455 A *  8/1999  Kobayashi ............. G05F 3/247
                                                        327/437

(Continued)

FOREIGN PATENT DOCUMENTS

JP    2005353274    12/2005
JP    2006066062     3/2006

(Continued)

OTHER PUBLICATIONS

J.-P. Noël et al., "Multi-Vt UTBB FDSOI device architectures for low-power CMOS circuit" IEEE Transactions on Electron Devices, vol. 58 p. 2473-2482, Aug. 1, 2011.

(Continued)

*Primary Examiner* — Douglas W Owens
*Assistant Examiner* — James H Cho
(74) *Attorney, Agent, or Firm* — Occhiuti & Rohlicek LLP

(57) ABSTRACT

A method for controlling an IC having logic cells and a clock-tree cell. Each logic cell has first and second FETs, which are pMOS and nMOS respectively. The clock-tree cell includes third and fourth FETs, which are pMOS and nMOS respectively. The clock-tree cell provides a clock signal to the logic cells. A back gate potential difference ("BGPD") of a pMOS-FET is a difference between its source potential less its back-gate potential, and vice versa for an nMOS-FET. The method includes applying first and second back gate potential difference (BGPD) to a logic cell's first and second FETs and either applying a third BGPD to a third FET, wherein the third BGPD is positive and greater than the first BGPD applied, which is applied concurrently, or applying a fourth BGEPD to a fourth FET, wherein the fourth BGPD is positive and greater than the second BGPD that is applied concurrently.

6 Claims, 3 Drawing Sheets

(51) Int. Cl.
*H01L 27/092* (2006.01)
*H01L 27/118* (2006.01)
*H01L 27/12* (2006.01)
*H03K 19/0185* (2006.01)

(52) U.S. Cl.
CPC ..... *H01L27/1203* (2013.01); *H03K 19/01855* (2013.01); *H03K 19/0013* (2013.01); *H03K 2217/0018* (2013.01)

(56) References Cited

U.S. PATENT DOCUMENTS

| | | | |
|---|---|---|---|
| 6,466,077 B1* | 10/2002 | Miyazaki et al. | 327/534 |
| 7,936,187 B1* | 5/2011 | Wu et al. | 327/94 |
| 8,482,070 B1* | 7/2013 | Flatresse et al. | 257/351 |
| 2001/0052632 A1 | 12/2001 | Wu et al. | |
| 2002/0149405 A1* | 10/2002 | Makino | 327/141 |
| 2003/0067318 A1* | 4/2003 | Takahashi et al. | 324/765 |
| 2008/0030224 A1* | 2/2008 | Dasgupta | 326/38 |
| 2009/0015293 A1* | 1/2009 | Ito | H03K 19/0016 326/81 |
| 2010/0182047 A1* | 7/2010 | Kim et al. | 326/103 |
| 2011/0127612 A1* | 6/2011 | Cha et al. | 257/368 |
| 2012/0146148 A1 | 6/2012 | Iwamatsu | |
| 2014/0025981 A1* | 1/2014 | Evans et al. | 713/501 |
| 2014/0054642 A1* | 2/2014 | Edwards et al. | 257/124 |

FOREIGN PATENT DOCUMENTS

| | | |
|---|---|---|
| JP | 2009044220 | 2/2009 |
| JP | 2009070939 | 4/2009 |
| WO | WO 98/54419 | 12/1998 |
| WO | WO 2012/160071 | 11/2012 |

OTHER PUBLICATIONS

J.-P. Noël et al., "UT2B-FDSOI device architecture dedicated to low power design techniques", 2010 Proceedings of The European Solid-State Device Research Conference, IEEE, p. 2106213, Sep. 14, 2010.

Hiramoto, Toshiro and Toshiharu Nagumo, "Multi-Gate MOSFETs with Back-Gate Control," 2006 IEEE International Conference on Integrated Circuit Design and Technology, 2006 (2 pages).

Abouzeid et al., "28nm CMOS, Energy Efficient and Variability Tolerant, 350nmV-to-1.0V, 10MHz/700MHz, 252bits Frame Error Decoder," 2012 Proceedings of the ESSCIRC (ESSCIRC).

* cited by examiner

METHOD FOR CONTROLLING AN INTEGRATED CIRCUIT

RELATED APPLICATIONS

This application claims the benefit of the Mar. 28, 2013 priority date of French application FR1352849, the contents of which are herein incorporated by reference.

FIELD OF INVENTION

The invention relates to a method for controlling an integrated circuit.

BACKGROUND

In a known manner, synchronous logic integrated circuits require a clock signal to synchronize operation of the logic elements of the circuit. Typically, this clock signal is distributed from a clock signal generator to elements of the circuit, such as registers or switches, by way of a clock tree. This clock tree is a network of electrical interconnects that typically has a tree-like structure, including a common trunk, connected to the clock signal generator. A multitude of branches divides off of this common trunk. Each of these branches can itself divide into a plurality of additional branches.

To ensure correct operation of the circuit, and especially to prevent setup and hold time violations, this clock tree must be carefully configured to limit the appearance of differences in the propagation time of the clock signal. These differences result in clock skew.

To avoid clock skew, the clock tree typically comprises clock tree cells that implement functions optimizing the distribution of the clock signal. Examples of such functions are buffer functions. Thus, each clock tree cell is connected to a branch of the clock tree and receives an input clock signal from this clock tree. This clock tree cell is also adapted to deliver an output clock signal for distribution to the logic elements of the circuit. In the case where the clock tree cell acts as a buffer, the output clock signal is identical to the input clock signal except that it is delayed by a pre-set amount of time. These buffers may be adapted, during design of the integrated circuit, to balance the branches of the clock tree and control the appearance of clock skew.

Typically, the circuit also comprises logic cells that contain transistors connected to form the logic elements of the circuit. Clock-tree cells located at the ends of the branches are electrically connected to the logic cells in order to transmit the output clock signal to them. These clock-tree cells located at the ends of the branches are clock-tree leaves.

As used herein, the term "standard cell" is understood to mean an integrated-circuit portion corresponding to the physical implementation of an elementary function. These standard cells result from models typically collected in an integrated circuit design software library. Standard cells can be differentiated from each other, for example, by the binary functions performed, or by their fan-out. In this patent application, a distinction is made between functional standard cells, used for the production of the logic functions of the circuit, and standard clock tree-cells. The former will be referred to as "logic cells," whereas the latter will be referred to as "clock cells."

Clock cells can differ from logic cells by particular characteristics such as the balancing of the rising and falling buffers, or else by a greater fan-out. The clock-tree cells conventionally used are structurally similar to the logic cells of the circuit. The leaf cells of the clock tree are preferably incorporated as close as possible to the logic cells, notably to reduce the length of the electrical connections connecting these leaf cells to the neighboring logic cells.

Nowadays, it is desirable to reduce the power consumption of integrated circuit devices, for example for nomadic IT applications. It is thus necessary to be able to make integrated circuits operate in specific low energy consumption modes, wherein the power supply voltage is reduced to an ultra-low voltage.

However, the reduction of the power supply voltage of such a circuit can cause deterioration in the performance of the clock tree. This deterioration originates, for example, from a greater sensitivity of the clock tree to variability in the fabrication process of the transistors, when the circuit is electrically powered with a supply voltage of reduced value. This greater sensitivity leads to a rise in the time constraint violations. It is then necessary to modify the clock tree by adding several elements to it, such as delays. This tends to complicate the design and the fabrication of the circuit.

A need therefore exists for an integrated circuit comprising a clock-tree cell whose performance has better robustness when the integrated circuit is powered with an electrical voltage of reduced value.

SUMMARY

In one aspect, the invention features a method for controlling an integrated circuit. Such a method includes providing an integrated circuit that includes logic cells, a clock-tree cell, and a semiconductor substrate, wherein the logic cells each comprise at least a first field-effect transistor and a second field-effect transistor, wherein the first field-effect transistor is a pMOS transistor, wherein the second field-effect transistor is an nMOS transistor, wherein the clock-tree cell includes at least a third field-effect transistor and a fourth field-effect transistor, wherein the third field-effect transistor is a pMOS transistor, wherein the fourth field-effect transistor is an nMOS transistor, wherein the clock tree cell is configured to provide a clock signal to the logic cells, wherein the logic cells and the clock-tree cell are formed on the semiconductor substrate, wherein each of the field-effect transistors includes a source, a drain, a conduction channel region, a gate stack, and a back gate, wherein the gate stack is disposed above the conduction channel region, wherein the back gate is disposed facing a gate on an opposite side of the conduction channel, and wherein a back gate potential difference of one of the field-effect transistors is defined as a difference between an electric potential applied to a source of the field-effect transistor less an electric potential applied to a back gate of the field-effect transistor, when the field-effect transistor is a pMOS transistor, and an electric potential applied to a back gate of the field-effect transistor less an electric potential applied to a source of the field-effect transistor, when the transistor is an nMOS transistor, the method further including applying a first back gate electric potential difference to a first field-effect transistor of a logic cell, applying a second back gate electric potential difference to a second field-effect transistor of the logic cell, and at least one of applying a third back gate electric potential difference to a third field-effect transistor, wherein the third back gate potential difference is positive, wherein the third back gate potential difference has a value that is greater than the first back gate potential difference applied, which is applied concurrently, and applying a fourth back gate electric potential difference to a fourth field-effect transistor, wherein the fourth back gate potential difference is positive, wherein the fourth back gate potential difference has a value that is greater than the second back gate potential difference that is applied concurrently.

Some practices of the method include applying a first back gate electric potential difference to a first field-effect transistor of a logic cell includes applying a potential difference having a positive value, and wherein applying a second back gate electric potential difference to a second field-effect transistor of the logic cell includes applying a potential difference having a positive value.

Other practices include applying a fourth back gate electric potential difference includes applying the fourth back gate electric potential difference concurrently and concurrently applying the third back gate electrical potential difference.

Among these practices are those in which providing an integrated circuit that includes logic cells, a clock-tree cell, and a semiconductor substrate includes providing first, second, third and fourth field-effect transistors that are bulk technology transistors, wherein conduction channels thereof are not electrically insulated from corresponding back gates by a layer of electrically insulating material, wherein the first and third field-effect transistors comprise corresponding first and third semiconductor wells having n-type doping, wherein the second and fourth field-effect transistors comprise corresponding second and fourth semiconductor wells having p-type doping, wherein each of the wells forms a back gate of a field-effect transistor, and providing the integrated circuit with first and second deep wells, each having doping of a type that is opposite a type of doping of the semiconductor substrate, wherein the first deep well extends under the first and second semiconductor wells so as to insulate the wells from the semiconductor substrate, wherein the second deep well extends under the third and fourth wells so as to insulate the third and fourth wells from the semiconductor substrate, wherein the first and second deep wells are not directly electrically connected to each other.

Also among these practices are those in which providing an integrated circuit that includes logic cells, a clock-tree cell, and a semiconductor substrate includes providing first, second, third, and fourth field-effect transistors that are FDSOI technology transistors and that each have a semiconductor back plane that is electrically insulated from the conduction channel by a layer of electrically insulating material, the back plane forming a back gate of the field-effect transistor, wherein each of the first and second field-effect transistors includes a semiconductor well placed under a back plane of the field-effect transistor, providing the clock cell with a third semiconductor well that extends just under the back planes of the third and fourth field-effect transistors, wherein the back planes and the third well are each doped with a dopant of the same type as a dopant of the semiconductor substrate, providing the integrated circuit with a deep semiconductor well that is doped with a dopant having a type that is opposite that of the dopant of the semiconductor substrate and that extends under the third well, and that is in direct contact with the third well, and applying a common electric potential to the back planes of the third and fourth field-effect transistors.

Additional practices of the method include providing an integrated circuit that includes logic cells, a clock-tree cell, and a semiconductor substrate includes providing an integrated circuit that further includes at least one of a semiconductor well and a deep semiconductor well, wherein the at least one of a semiconductor well and a deep semiconductor well has a doping that is opposite to a doping of the semiconductor substrate, wherein the at least one of a semiconductor well and a deep semiconductor well is interposed between the back gate of the third field-effect transistor and the semiconductor substrate, and wherein the at least one of a semiconductor well and a deep semiconductor well is electrically insulated from the back gate of the first field-effect transistor by way of a p-n junction, wherein the p-n junction is a p-n junction that is able to be reverse biased during operation of the integrated circuit.

Among the foregoing practices are those in which providing an integrated circuit that further includes at least one of a semiconductor well and a deep semiconductor well includes providing the at least one of a semiconductor well and a deep semiconductor well to be interposed between the back gate of the fourth field-effect transistor and the semiconductor substrate, wherein the at least one of a semiconductor well and a deep semiconductor well is electrically insulated from the back gate of the second field-effect transistor by way of a p-n junction, wherein the p-n junction is a p-n junction that can be reverse biased during operation of the integrated circuit.

In yet other practices, providing an integrated circuit that includes logic cells, a clock-tree cell, and a semiconductor substrate includes providing first, second, third and fourth field-effect transistors that are FDSOI technology transistors, each of which has a semiconductor back plane that is electrically insulated from a conduction channel thereof by a layer of electrically insulating material, the back plane forming a back gate of the field-effect transistor, wherein the first and third field-effect transistors include corresponding first and third semiconductor wells that have a doping of a first type and that extend under the back gates of the first and third field-effect transistors respectively, wherein the second and fourth field-effect transistors include corresponding second and fourth semiconductor wells having a doping of a second type that is opposite to the first type and that extend under the back gates of the second and fourth field-effect transistors respectively, providing the integrated circuit with a deep semiconductor well that is doped with a dopant of type opposite that of the semiconductor substrate, that extends under the wells, and that is in direct contact with the wells, and applying only one of the third back gate potential difference and the fourth back gate potential difference.

Additional practices include those in which providing an integrated circuit that includes logic cells, a clock-tree cell, and a semiconductor substrate includes providing first, second, third, and fourth field-effect transistors that are bulk technology transistors, wherein the conduction channel is not electrically insulated from the back gate by a layer of electrically insulating material, wherein the first and third field-effect transistors include corresponding first and third semiconductor wells having n-type doping, wherein the second and fourth field-effect transistors include corresponding second and fourth semiconductor wells having p-type doping, wherein the wells form corresponding back gates of the field-effect transistors and wherein the wells are in direct electrical contact with the semiconductor substrate, and applying only the third back gate potential difference and not the fourth back gate potential difference.

Yet other practices include those in which providing an integrated circuit that includes logic cells, a clock-tree cell, and a semiconductor substrate includes providing first, second, third and fourth field-effect transistors that are bulk technology transistors, wherein the conduction channel is not electrically insulated from the back gate by a layer of electrically insulating material, the first and third field-effect transistors including corresponding first and third semiconductor wells having n-type doping, the second and fourth field-effect transistors including corresponding second and fourth semiconductor wells having p-type doping, providing a deep semiconductor well having doping of opposite type to the doping of the semiconductor substrate, the deep well extending at once under the first, second, third and fourth semiconductor wells so as to insulate the first, second, third and fourth semiconductor wells from the semiconductor substrate, and applying the fourth back gate potential difference but not the third back gate potential difference.

The application of the third and/or fourth back gate potential difference makes it possible to modulate the threshold voltage of the third and/or fourth transistors respectively. More precisely, when the integrated circuit is powered by a reduced electrical voltage, the choice is made to apply a back gate potential difference chosen to lower this threshold voltage with respect to the threshold voltage of the transistors of the logic cells. This results in an increase in the fan-out of the clock cell. This increase will compensate, for this clock cell, for the reduction in the supply voltage of the circuit and the increase in the transition time of its output resulting therefrom. The clock cell, although powered with a reduced voltage, retains its fan-out and the transition time of its output, which reduces the performance deterioration of the clock cells. Thus, the electrical performance of the clock tree is improved.

An advantage of at least some embodiments of the invention is that the use of the first and second deep wells allows, in bulk technology, allows the simultaneous application of the third and fourth potential differences;

An advantage of at least some embodiments of the invention is that the use of transistors with FDSOI technology makes it possible to apply higher back gate potential differences than in bulk technology, which makes it possible to have increased control of the behavior of the clock cell.

An advantage of at least some embodiments of the invention is that the application of only one or the other of the third or fourth back gate potential differences makes it possible to modify only the properties of the pMOS or nMOS transistor of the clock cell, and therefore to act only on rising or falling edges of the clock signal.

BRIEF DESCRIPTION OF THE DRAWINGS

The invention will be better understood upon reading the following description, given solely by way of non-limiting example and made with reference to the drawings wherein.

In these figures, the same reference numbers are used to designate the same elements.

In the remainder of this description, characteristics and functions well known to those skilled in the art are not described in detail.

DETAILED DESCRIPTION

Figure 1:
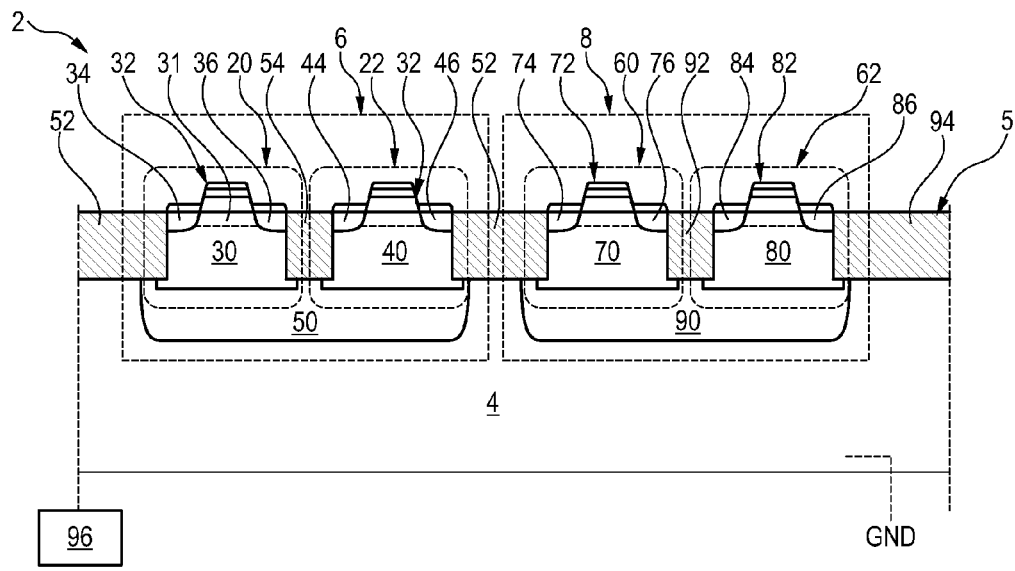
FIG. 1 is a schematic illustration, in a sectional view, of a portion of an integrated circuit including a clock cell and a logic cell.

FIG. 1 shows, in a simplified manner, a part of an integrated circuit 2. The circuit 2 includes a semiconductor substrate 4, a logic cell 6, and a clock cell 8.

The substrate 4 extends essentially in a substrate plane, which is shown as horizontal. This substrate plane forms a lower part of the circuit 2. The illustrated substrate 4 has p-type doping with a dopant concentration of less than or equal to $10^{16}$ cm$^{-3}$ or to $3*10^{15}$ cm$^{-3}$. The substrate 4 is electrically connected to an electrical ground GND of the circuit 2. The circuit 2 has a horizontal upper face 5.

The circuit 2 can include a plurality of logic cells, which can be identical cells. These logic cells receive a clock signal provided by one and the same clock-tree cell. However, to simplify the figures, only one logic cell 6 and one clock-tree cell 8 are represented.

The cell 6 includes first and second metal-oxide semiconductor field-effect transistors (MOSFET) 20, 22. These transistors 20, 22 are produced using bulk technology.

The first transistor 20, formed in and on a semiconductor well 30 thus includes a gate stack 32, arranged just above the well 30, the stack 32 including a gate, a source 34, and a drain 36, both of which are arranged above or in the well 30 and each of which is on one side of the stack 32.

The well 30 is situated above the substrate 4 and extends essentially parallel to the substrate plane. This well 30 is, for example, formed by dopant implantation from the upper face 5 of the circuit 2. In this example, the transistor 20 is a pMOS transistor. The well 30 has n-type doping. The source 34 and the drain 36 have p-type doping.

In a field-effect transistor, the application of adequate electric potentials to the source, the gate and the drain of the transistor leads to the formation of an electrical conduction channel in a channel region 31, in the well 30, between the source 34 and the drain 36. The well 30 can be electrically biased to modify properties of this channel such as, notably, the transistor threshold voltage. The well 30 therefore includes a contact tap (not illustrated in detail in FIG. 1) enabling this electric potential to be applied. The well 30 therefore forms a back gate of the transistor 20. Each of the sources 34 and drains 36 includes an electrical contact tap to enable application of an electric potential to the source 34 and the drain 36 respectively.

The second transistor 22 is identical to the first transistor 20, except that the well 30 is replaced by a well 40 of opposite doping and the source 34 and the drain 36 are replaced, respectively, by a source 44 and a drain 46 of opposite doping. Thus, the second transistor 22 is an nMOS transistor. Its well 40 has p-type doping. Its source 44 and its drain 46 both have n-type doping. Apart from these differences, everything that has been said with reference to the first transistor 20 applies to the second transistor 22.

The cell 6 furthermore includes a deep well 50 situated just under the wells 30 and 40, in direct contact with these wells 30 and 40, to electrically insulate these wells 30 and 40 from the substrate 4. The deep well 50 has n-type doping. Thus, the deep well 50 is in electrical contact with the well 30, but forms with the well 40 a p-n junction able to be reverse biased. In this description, the thickness and the depth are defined with respect to the vertical direction, perpendicular to the face 5. The depth is defined with respect to a horizontal reference plane, passing, for example, through the face 5.

In this description, two elements are said to be in direct contact if they are in immediate physical contact with one another and if no other element of different nature is interposed between these two elements.

The cell includes first and second isolation trenches 52 and 54. The trench 52 isolates the conduction channels of the transistors of the cell 6 from the conduction channels of the other transistors of the adjacent cells. The trench 54 isolates the conduction channels of the first and second transistors 20 and 22 from each other. In the illustrated example, these trenches 52 and 54 are vertical. The first trench 52 surrounds the cell 6 over its whole outer circumference. The second trench 54 extends between the transistors 20 and 22. These trenches 52 and 54 are produced with an electrically insulating material. The term "electrically insulating material" is understood to mean a material with an electrical resistivity, at a temperature of 20° C., greater than or equal to $10^5 \Omega \cdot m$ or to $10^6 \Omega \cdot m$. In one example, the first and second trenches 52 and 54 are produced from silicon oxide ($SiO_2$).

The cell 8 is able to provide a clock signal to the transistors of the cell 6. Here, the clock signal is a periodic signal having an alternating succession of rising and falling edges. This cell 8 belongs to a clock tree of the circuit 2. The cell 8 is here contiguous with the cell 6. The cell 8 includes transistors 60 and 62. These transistors 60 and 62 are identical to the transistors 20 and 22 respectively. Everything that is described with reference to the transistors 20 and 22 therefore applies to the transistors 60 and 62. However, wells 70 and 80 correspond to the wells 30 and 40 respectively; the gate stacks 72, 82 corresponding to the stacks 32 and 42 respectively; the sources 74, 84 correspond to the sources 34 and 44 respectively; and the drains 76, 86 correspond to the drains 36 and 46 respectively.

In this description, two so-called "identical" cells can have geometrical differences, made necessary by circuit design steps for example, to adapt these cells to the electrical connections with other cells of the circuit, contiguous with these cells. For example, these differences are rendered necessary during placement steps during the automatic generation of a circuit topology. The same goes for so-called "identical" transistors.

The cell 8 furthermore includes a deep well 90, for example identical to the deep well 50, except that it is situated just under the wells 70 and 80. These deep 50 and 90 are distinct and separate from each other, so as not to be in direct electrical contact with each other. In the illustrated embodiment, these wells 50 and 90 are separated from each other by a portion of the substrate 4 that has a doping of a type opposite to that of the wells 50 and 90, to prevent direct electrical conduction between these two wells 50 and 90. The wells are separated by at least one p-n junction that is able to be reverse biased during the operation of the circuit. The wells 30, 40 are electrically insulated from the wells 70, 80. Thus, separate electric potentials can be applied to the wells 30 and 70. The same goes for the wells 40 and 80.

Furthermore, the well 90 is electrically insulated from the back gate of the transistor 20 by way of a p-n junction that is able to be reverse biased during the operation of the integrated circuit. This p-n junction is formed by the well 50 in direct contact with the substrate 4.

Advantageously, the cell 8 includes isolation trenches 92 and 94 respectively identical to the trenches 52 and 54. Here, the cells 6 and 8 being side by side, one portion of the trench 52 is common with the trench 94. In FIG. 1, the reference 52 designates this common part.

The circuit 2 furthermore includes an electrical biasing device 96 that is able to apply electric potentials to the wells 30, 40, 70, 80 and to the electrodes of the transistors 20, 22, 60, 62. The term "electrodes" of a transistor, refers to the drain, the source and the gate of the transistor. With this aim, this device 96 includes a network of electrical interconnections, electrically connected to these wells and to the electrodes of these transistors. To simplify FIG. 1, this network of interconnections is not represented.

This device 96 is notably able to apply distinct back gate potential differences, i.e. back biasing, to each of these transistors. The back gate potential difference of a transistor is defined as being the value of the electric potential applied to the source less the value of the potential applied to the back gate of this transistor, when this transistor is a pMOS, and as the value of the electric potential applied to the back gate less the value of the potential applied to the source of this transistor, when this transistor is an nMOS.

Figures 2, 3A, 3B:
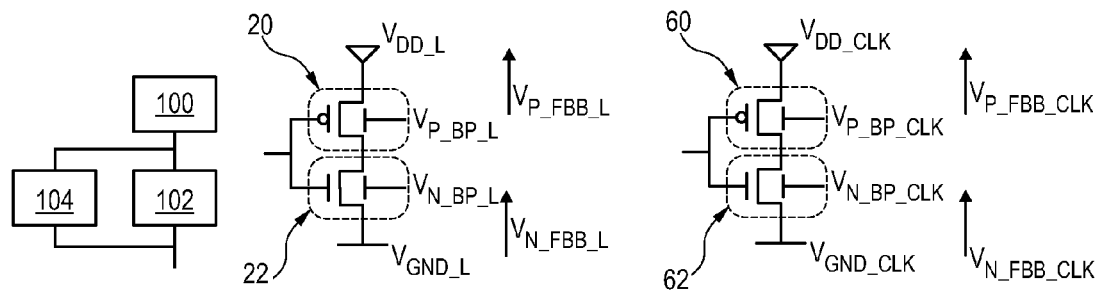
FIG. 2 is a block diagram of a method for controlling the clock cell in FIG. 1.
FIGS. 3A and 3B are circuit diagrams illustrating electric potentials applied to the transistors of the cells, logic and clock respectively, of the circuit in FIG. 1.

A method for controlling the circuit 2 will now be described, with reference to the block diagram in FIG. 2 and using FIGS. 1, 3A and 3B.

In step 100, the circuit 2 is provided. This circuit is, for example, switched on and powered by an electrical voltage source, for example at a reduced voltage.

Then, in step 102, electric potentials are applied to the transistors of the cell 6. Notably, the device 96 applies: potentials $V_{DD\_L}$ and $V_{GND\_L}$ to the sources 34 and 44 respectively; and potentials $V_{P\_BP\_L}$ and $V_{N\_BP\_L}$ to the wells 30 and 40 respectively.

The values of these applied potentials are chosen in such a way that the back gate potential differences $V_{P\_FBB\_L}=V_{DD\_L}-V_{P\_BP\_L}$, and $V_{N\_FBB\_L}=V_{N\_BP\_L}-V_{GND\_L}$, respectively, of the transistors 20 and 22, have a positive value (forward back biasing.) These electric potentials are recapitulated in FIG. 3A. Here, the transistors 20 and 22 are interconnected to form a logic inverter with CMOS (Complementary Metal Oxide Semiconductor) technology. These values have also been chosen to avoid forward biasing p-n junctions formed by wells, between each other or with the substrate, which would have the effect of causing leakage currents in the circuit 2. For example, here, $V_{DD\_L}=1.2$ V; $V_{GND\_L}=0$ V; $V_{P\_BP\_L}=1$ V; and $V_{N\_BP\_L}=0.3$ V.

In parallel, during step 104, electric potentials are applied to the transistors of the cell 8. In particular, the device 96 applies: potentials $V_{DD\_CLK}$ and $V_{GND\_CLK}$ to the sources 74 and 84 respectively; and potentials $V_{P\_BP\_CLK}$ and $V_{N\_BP\_CLK}$ to the wells 70 and 80 respectively. Typically, the potentials $V_{DD\_CLK}$ and $V_{GND\_CLK}$ are equal to the potentials $V_{DD\_L}$ and $V_{GND\_L}$ respectively The values of these potentials $V_{P\_BP\_CLK}$ and $V_{N\_BP\_CLK}$ are chosen in such a way that the back gate potential differences $V_{P\_FBB\_CLK}=V_{DD\_CLK}-V_{P\_BP\_CLK}$, and $V_{N\_FBB\_CLK}=V_{N\_BP\_CLK}-V_{GND\_CLK}$, of the transistors 60 and 62 respectively have a positive value (forward back biasing). These electric potentials are recapitulated in FIG. 3B. Here, the transistors 60 and 62 are interconnected to form a CMOS logic inverter.

In this example, the device 96 applies potentials $V_{P\_BP\_CLK}$ and $V_{N\_BP\_CLK}$ such that at least one of the following two relationships is satisfied: (1) $V_{P\_FBB\_CLK}$ has a value strictly greater than $V_{P\_FBB\_L}$, and (2) $V_{N\_FBB\_CLK}$ has a value strictly greater than $V_{N\_FBB\_L}$.

For example, $V_{P\_FBB\_CLK}$ is greater than $1.01*V_{P\_FBB\_L}$ or than $1.05*V_{P\_FBB\_L}$ and, preferably, less than $1.3*V_{P\_FBB\_L}$ or than $1.5*V_{P\_FBB\_L}$. In the same way, $V_{N\_FBB\_CLK}$ is greater than $1.01*V_{N\_FBB\_L}$ or than $1.05*V_{N\_FBB\_L}$ and, preferably, greater than $1.3*V_{N\_FBB\_L}$ or than $1.5*V_{N\_FBB\_L}$. In this example, since these two relationships can be satisfied simultaneously, then $V_{P\_BP\_CLK}$ is here less than 1V and $V_{N\_BP\_CLK}$ is here greater than 0.3V or than 0.4 V.

The transistors of the cell 8 thus have a back gate potential difference separate from that applied to the transistors of the cell 6. The chosen values notably make it possible to lower the threshold voltage of the transistors of the cell 8 with respect to the threshold voltage of the transistors of the cell 6. When the circuit 2 operates in a low power consumption mode and the nominal supply voltage of the transistors is reduced, the lowering of the threshold voltage of the transistors 60 and 62 makes it possible to increase their electrical fan-out and therefore to reduce the transition time of the clock signal exiting this cell, to compensate for the reduction in the supply voltage. This improves the operation of the transistors 60 and 62, and therefore improves the reliability and the performance of the clock tree as a whole.

This modulation of the threshold voltage is furthermore modifiable during the use of the circuit 2, by contrast with circuits wherein these threshold voltages are fixed at the time of the fabrication of the circuit, for example by choosing specific doping properties for the wells of the transistors of the cell 8.

Figure 4:
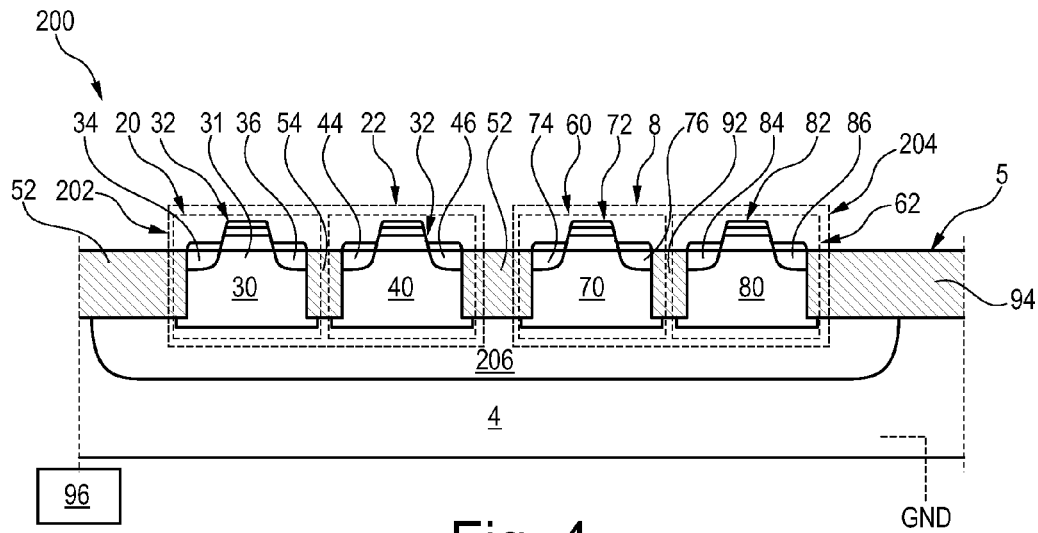
FIGS. 4 to 8 are schematic illustrations, in a sectional view, of other embodiments of the logic and clock cells of FIG. 1.

FIG. 4 shows a circuit 200 that is able to replace the circuit 2. This circuit 200 is identical to the circuit 2, except that cells 202 and 204 replace the cells 6 and 8, respectively. The cells 202 and 204 are identical to the cells 6 and 8 respectively, except that a single deep well 206 replaces the wells 50 and 90. The well 206 extends in the plane of the substrate, under and in direct contact with the wells 30, 40, 70 and 80. In the illustrated embodiment, the well 206 has n-type doping, for example of the same type as the wells 50 and 90.

Thus, the wells 30 and 70, both of which are n-doped, make electrical contact with each other by way of the well 206. The wells 40 and 80, both of which are p-doped, are electrically insulated from each other and also insulated from the substrate 4 by the well 206. Actually, it is still possible to apply distinct potentials $V_{N\_BP\_L}$ and $V_{N\_BP\_CLK}$ to these wells 40 and 80 respectively. On the other hand, the wells 30 and 70, both of which are n-doped, are biased to one and the same electric potential by way of the well 206, and therefore $V_{P\_BP\_L}=V_{P\_BP\_CLK}$.

In this case, for this circuit 200, during the step 104, only the relationship $V_{N\_FBB\_CLK}>V_{N\_FBB\_L}$ is satisfied. The transistor 62 has a reduced threshold voltage, but this is not the case for the transistor 60. The performance of the cell 204 is only partially improved. Specifically, with respect to the example described with reference to the circuit 2, no back gate potential separate from that applied to the pMOS transistors of the cell 202 can be applied to the pMOS transistors of the cell 204. However, this configuration nonetheless makes it possible to modify the performances of the nMOS transistor of the cell 204. With the inverter circuit formed by the transistors of the cell 8, the modification of the performance of the nMOS transistors of the cell 204 makes it possible to accelerate the falling edges of the clock signal exiting the cell 8 in response to an input clock signal and thus to limit the appearance of propagation time differences in the clock signal. The crossing, by the input clock signal, of several clock cells, identical to cell 8 and connected electrically in series accelerates the two edges of the output clock signal.

Figure 5:
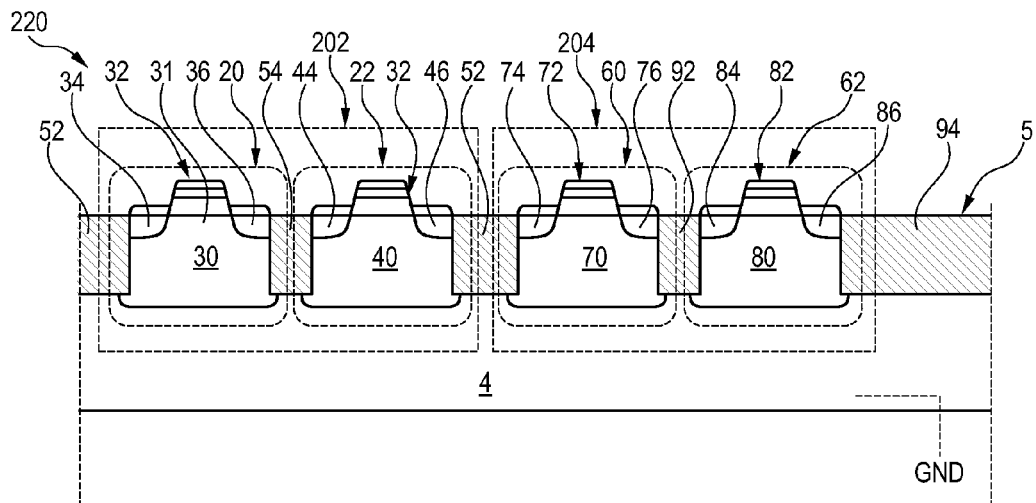

FIG. 5 shows a circuit 220 that is able to replace the circuit 4 or 200. This circuit 220 is identical to the circuit 200, except that the well 206 is omitted. In this case, the wells 30, 40, 70 and 80 are all in direct contact with the substrate 4. In particular, the wells 40 and 80, both of which are p-doped, are in electrical contact with each other by way of the substrate 4. On the other hand, the wells 30 and 70, both of which are n-doped, are electrically insulated from each other by the substrate 4, p-doped. Actually, it is still possible to apply distinct potentials $V_{P\_BP\_L}$ and $V_{P\_BP\_CLK}$ to these wells 40 and 80 respectively. On the other hand, the wells 30 and 70 are biased at one and the same electric potential, and therefore $V_{N\_BP\_L}=V_{N\_BP\_CLK}$. This same electric potential is here equal to zero, since the substrate 4 is here electrically connected to the ground GND of the circuit.

In this case, for this circuit 200, during step 104, only the relationship $V_{P\_FBB\_CLK}>V_{P\_FBB\_L}$ is satisfied. The transistor 60 has a reduced threshold voltage, but this is not the case for the transistor 62. The performance of the cell 204 is only partially improved. In a manner analogous to that which has been described with reference to the circuit 200, the inverter circuit formed by the transistors of the cell 204 makes it possible, by modifying the performance of the pMOS transistors of the cell 204, to accelerate the rising edges of the input clock signal and thus to limit the appearance of clock skew in the clock signal.

Figure 6:
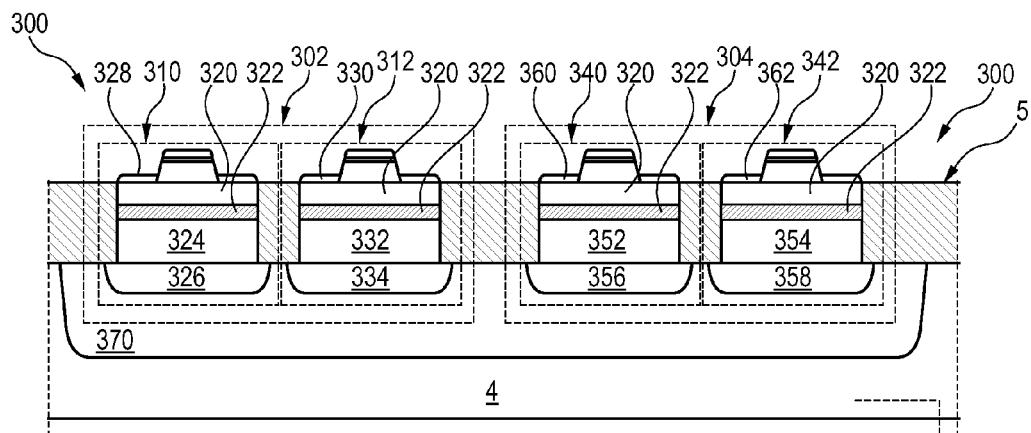

FIG. 6 describes a circuit 300 that is able to replace the circuit 4. This circuit is identical to circuit 4, except that cells 302 and 304 replace the cells 6 and 8 respectively. These cells 302 and 304 are identical to cells 6 and 8 respectively, except that MOS transistors with FDSOI (Fully Depleted Silicon On Insulator) technology replace the transistors 20, 22, 60 and 62.

The cell 302 thus includes transistors 310 and 312. The transistor 310 includes a semiconductor layer 320, called the "active" layer; a semiconductor back plane 324, situated under the layer 320; a buried layer 322 of electrically insulating material, interposed between the layer 320 and the back plane 324 to electrically insulate the layer 320 from the back plane 324; and a semiconductor well 326, situated just under the back plane 324.

The layer 320 forms a channel between a source 328 and a drain of the transistor. In FDSOI technology, this layer 320 is in a depleted state and has a very low level of doping, typically less than or equal to $10^{15}$ cm$^{-3}$. This layer 320 has a thickness of less than or equal to 50 nanometers.

The layer 322 is of ultra-thin UTBOX (Ultra-Thin Buried Oxide layer) type and has a thickness of less than 40 nanometers and, preferably, less than or equal to 25 nanometers.

The back plane 324 forms a back gate of the transistor 20. This back plane 324 is situated directly and only on the well 326, so that an electric potential can be applied to it by way of the well 326. Typically, in FDSOI technology, for the 28 nanometer technology node, the application of an electric potential of a back plane is provided by way of a semiconductor well in direct contact with the back plane and having doping of the same type as this back plane. With this aim, the back plane 324 extends horizontally and is arranged immediately above the well 326 in direct contact with this well 326 so as to be situated just under the layer 320. In this example, the back plane 324 has a doping of the same type as the doping of the well 326. The dopant concentration of the back plane 324 here lies between $10^{18}$ and $10^{20}$ cm$^{-3}$. This back plane 324 here has a thickness of between 50 nanometers and 300 nanometers and, preferably, between 70 nanometers and 200 nanometers. In the illustrated embodiment, the back plane 324 and the well 326 are fabricated from one and the same semiconductor material by application of distinct steps of ion implantation.

In this example, the transistor 310 is of pMOS type. For example, the back plane 324 and the well 326 have p-type doping.

The transistor 312 is identical to the transistor 310, except that the transistor 312 is of nMOS type with a source 330 corresponding to the source 328 and the back plane corresponding to the back plane 324 and the well corresponding to the well 326 are replaced, respectively, by a back plane 332 and a well 334 from which they differ only by the type of doping. This back plane 332 and this well 334 here have n-type doping.

The cell 304 plays the same role as the cell 8. The cell 304 includes two transistors 340 and 342, identical to the transistors 310 and 312 respectively. Everything that is described with reference to transistors 310 and 312 therefore applies to transistors 340 and 342. However, in this case, the back planes 352, 354 correspond to the back planes 324 and 332; the wells 356 and 358 correspond to the wells 326 and 334, and the sources 360 and 362 correspond to the sources 328 and 330.

The circuit 300 furthermore comprises a deep well 370. This well 370 extends under and is in direct contact with the wells 326, 334, 356 and 358 to electrically insulate these wells from the substrate 4. This well 370 is, for example, identical to the well 206.

During steps 102 and 104, the device 96 applies the potentials $V_{DD\_L}$ and $V_{GND\_L}$ to the sources 328 and 330 respectively; the potentials $V_{P\_BP}\_L$ and $V_{N\_BP}\_L$ to the wells 326 and 334 respectively; the potentials $V_{DD\_CLK}$ and $V_{GND\_CLK}$ to the sources 360 and 362 respectively; and potentials $V_{P\_BP\_CLK}$ and $V_{N\_BP\_CLK}$ to the wells 356 and 358 respectively.

These electric potential values are chosen to comply with the relationship $V_{P\_FBB\_CLK} > V_{P\_FBB\_L}$. With respect to the case described with reference to circuit 2, these potential values are also chosen to avoid forward biasing p-n junctions formed by wells between each other or with the substrate as forward biasing could cause leakage currents in the circuit 300.

The wells 326 and 356, both of which are p-doped, are electrically insulated from each other and also from the substrate 4 by the well 370. It is possible to apply distinct potentials $V_{P\_BP}\_L$ and $V_{P\_BP\_CLK}$ to these wells 326 and 356 respectively. On the other hand, the wells 334 and 358 are biased at one and the same electric potential, and therefore $V_{N\_BP\_L} = V_{N\_BP\_CLK}$.

The use of transistors of FDSOI technology makes it possible to apply higher values of back gate potential difference with respect to transistors of bulk technology, and therefore to further limit the appearance of clock skew in the clock signal. For example, the maximum value of the back gate potential difference of FDSOI transistors is 1.5 times or 2 times greater than the maximum value of the back gate potential difference of bulk transistors.

Figure 7:
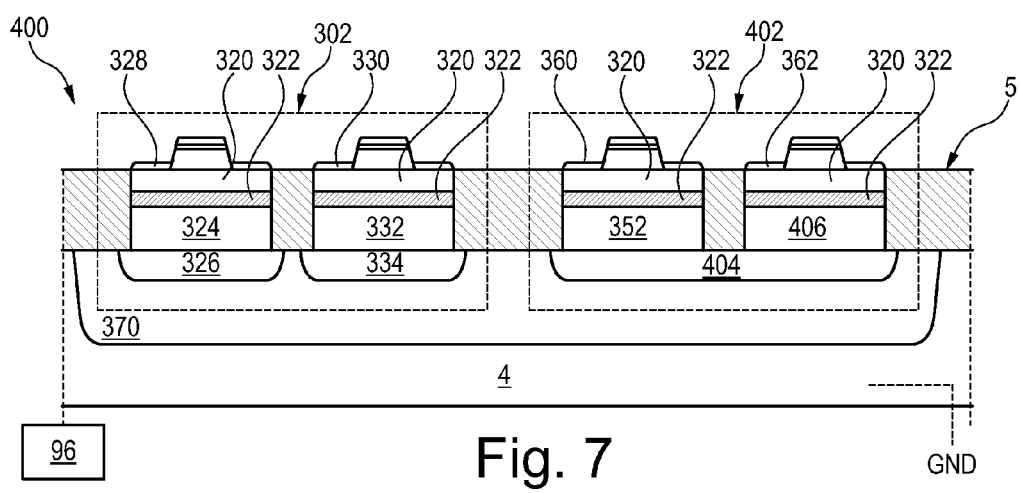

FIG. 7 shows a circuit 400 that can be used instead of the circuit 300. This circuit 400 differs from the circuit 300 only by the fact that a cell 402 replaces the cell 304. This cell is identical to the cell 304, except that a single well 404 replaces the wells 356 and 358; and a p-doped back plane 406 replaces the back plane 354. Thus, the back planes 352 and 406 are insulated from the substrate 4 by way of this well 404, which makes it possible to modulate the threshold voltage of the transistors 340 and 342 simultaneously.

During step 104, the device 96 applies one and the same electric potential to the well 406, and therefore to the back planes 352 and 406.

In alternative embodiments, the substrate 4 can have n-doping. In this case, the respective dopings of the deep wells can be chosen differently.

In other embodiments, the cell 6 can include more than two pMOS and/or nMOS transistors that are identical to the transistors 20, 22 respectively. In this case, a back gate potential difference can be applied to these transistors in the same way as to the transistors 20, 22, respectively. The same applies for the cell 8.

The method, and step 104 in particular, is not necessarily permanently applied over the whole operating time of the circuit 2. For example, step 104 is not applied when circuit 2 is on stand-by. When step 104 is not applied, back gate potential differences $V_{P\_FBB\_CLK}$ and $V_{N\_FBB\_CLK}$ can still be applied, but there potential differences will not then satisfy the relationships $V_{N\_FBB\_CLK} > V_{N\_FBB\_L}$ and $V_{P\_FBB\_CLK} > V_{P\_FBB\_L}$. Step 104 can also only be applied solely to cells belonging to a portion of the circuit 2.

The circuits 300 and 400 can be produced using an FDSOI fabrication technology other than 28 nanometer technology, such as the 14 nanometer FDSOI technology for example. In this case, the back planes can be forward biased without involving the semiconductor wells. The wells 326, 334, 356, 358 and 404 can therefore be omitted or have doping types that differ from that of the back plane under which they are respectively situated.

The deep well 370 can be replaced by two deep wells, identical to wells 50 and 90 respectively and playing the same role as these wells 50 and 90 to electrically insulate, from the substrate, the wells 326, 334 and the wells 356 and 358 respectively.

Figure 8:
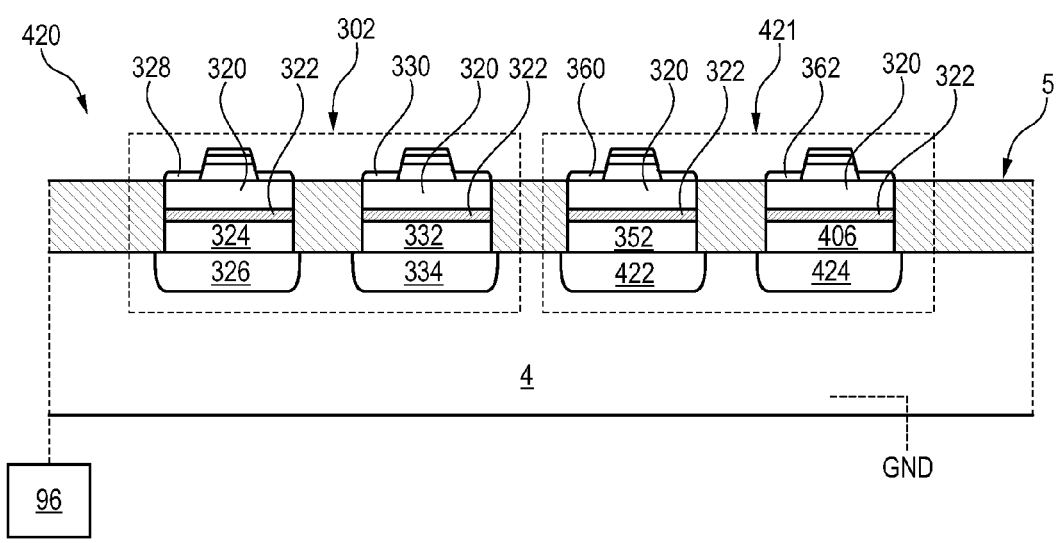

FIG. 8 shows a circuit 420 producing using 20 nanometer FDSOI technology that can be used in place of the circuits 300 or 400. This circuit 420 is identical to the circuit 300, except that the electrical insulation of the back gates of the transistors of the clock cell 304 from that of the transistors of the logic cell 302 is provided by the respective wells of these transistors. With this aim, the deep well 370 is omitted, and the cell 402 is replaced by a cell 421, which is identical to the cell 402 except that the wells 356 are 358 are replace, by wells 422 and 424 respectively, both of which have n-type doping, opposite to the doping of the substrate 4. These wells 422 and 424 thus form, with the substrate 4, p-n junctions that can be reverse biased during the operation of the circuit 420.

Furthermore, the circuit 96 is then configured to apply a potential equal to GND to the wells that have one and the same type of doping as the substrate 4, namely, here, to apply a potential $V_{P\_BP\_L} = 0V$ to the well 326.

The back planes 324 and 332 can be swapped. In this case, the wells 326 and 334 are also swapped. The same applies for the back planes 352 and 354 and the wells 356 and 358. The back planes 352, 406 and the well 404 can have a different doping.

The electric potentials applied to the various wells can take values that are different from those described with reference to step 102.

The back gate potential differences $V_{P\_FBB\_L}$ and $V_{N\_FBB\_L}$ can have negative values (reverse back biasing). In this case, the values of these back gate potential differences are chosen so as to avoid the formation of conducting diodes between regions of opposite doping of the cells 6 and 8. Formation of such diodes could cause leakage currents in the circuit 2. To simplify the description, the FBB notation is retained in the index of the symbols $V_{P\_FBB\_L}$ and $V_{N\_FBB\_L}$.

Having described the invention, and a preferred embodiment thereof, what is claimed as new and secured by Letters Patent is:

1. A method for controlling an integrated circuit, said method comprising providing an integrated circuit that comprises logic cells, a clock-tree cell, and a semiconductor substrate, wherein said logic cells each comprise at least a first field-effect transistor and a second field-effect transistor, wherein said first field-effect transistor is a pMOS transistor, wherein said second field-effect transistor is an nMOS transistor, wherein said clock-tree cell comprises at least a third field-effect transistor and a fourth field-effect transistor, wherein said third field-effect transistor is a pMOS transistor, wherein said fourth field-effect transistor is an nMOS transistor, wherein said clock tree cell is configured to provide a clock signal to said logic cells, wherein said logic cells and said clock-tree cell are formed on said semiconductor substrate, wherein each of said field-effect transistors comprises a source, a drain, a conduction channel region, a gate stack, and a back gate, wherein said gate stack is disposed above said conduction channel region, wherein said back gate is disposed facing said gate stack on an opposite side of said conduction channel, and wherein a back gate potential difference of one of said field-effect transistors is defined as a difference between an electric potential applied to said source of said field-effect transistor less an electric potential applied to said back gate of said field-effect transistor, when said field-effect transistor is a pMOS transistor, and an electric potential applied to said back gate of said field-effect transistor less an electric potential applied to said source of said field-effect transistor, when said field-effect transistor is an nMOS transistor, said method further comprising applying a first back gate electric potential difference to a first field-effect transistor of a logic cell, applying a second back gate electric potential difference to a second field-effect transistor of said logic cell, and only one of applying a third back gate electric potential difference to said third field-effect transistor, wherein said third back gate potential difference is positive, wherein said third back gate potential difference has a value that is greater than said first back gate potential difference applied, which is applied concurrently, and applying a fourth back gate electric potential difference to said fourth field-effect transistor, wherein said fourth back gate potential difference is positive, wherein said fourth back gate potential difference has a value that is greater than said second back gate potential difference that is applied concurrently.

2. The method of claim 1, wherein applying said first back gate electric potential difference to said first field-effect transistor of a logic cell comprises applying a potential difference having a positive value, and wherein applying said second back gate electric potential difference to said second field-effect transistor of said logic cell comprises applying a potential difference having a positive value.

3. The method of claim 1, wherein providing an integrated circuit that comprises logic cells, a clock-tree cell, and a semiconductor substrate comprises providing an integrated circuit that further comprises at least one of a semiconductor well and a deep semiconductor well, wherein said at least one of a semiconductor well and a deep semiconductor well has a doping that is opposite to a doping of said semiconductor substrate, wherein said at least one of a semiconductor well and a deep semiconductor well is interposed between said back gate of said third field-effect transistor and said semiconductor substrate, and wherein said at least one of a semiconductor well and a deep semiconductor well is electrically insulated from said back gate of said first field-effect transistor by way of a p-n junction, wherein said p-n junction is a p-n junction that is able to be reverse biased during operation of said integrated circuit.

4. The method of claim 1, wherein providing an integrated circuit that comprises logic cells, a clock-tree cell, and a semiconductor substrate comprises providing first, second, third and fourth field-effect transistors that are FDSOI technology transistors, each of which has a semiconductor back plane that is electrically insulated from a conduction channel thereof by a layer of electrically insulating material, said back plane forming a back gate of said field-effect transistor, wherein said first and third field-effect transistors include corresponding first and third semiconductor wells that have a doping of a first type and that extend under said back gates of said first and third field-effect transistors respectively, wherein said second and fourth field-effect transistors include corresponding second and fourth semiconductor wells having a doping of a second type that is opposite to said first type and that extend under said back gates of said second and fourth field-effect transistors respectively, providing said integrated circuit with a deep semiconductor well that is doped with a dopant of type opposite that of said semiconductor substrate, that extends under said wells, and that is in direct contact with said wells, and applying only one of said third back gate potential difference and said fourth back gate potential difference.

5. The method of claim 1, wherein providing an integrated circuit that comprises logic cells, a clock-tree cell, and a semiconductor substrate comprises providing first, second, third, and fourth field-effect transistors that are bulk technology transistors, wherein said conduction channel is not electrically insulated from said back gate by a layer of electrically insulating material, wherein said first and third field-effect transistors include corresponding first and third semiconductor wells having n-type doping, wherein said second and fourth field-effect transistors include corresponding second and fourth semiconductor wells having p-type doping, wherein said wells form corresponding back gates of said field-effect transistors and wherein said wells are in direct electrical contact with said semiconductor substrate, and applying only said third back gate potential difference and not said fourth back gate potential difference.

6. The method of claim 1, wherein providing an integrated circuit that comprises logic cells, a clock-tree cell, and a semiconductor substrate comprises providing first, second, third and fourth field-effect transistors that are bulk technology transistors, wherein said conduction channel is not electrically insulated from said back gate by a layer of electrically insulating material, said first and third field-effect transistors including corresponding first and third semiconductor wells having n-type doping, said second and fourth field-effect transistors including corresponding second and fourth semiconductor wells having p-type doping, providing a deep semiconductor well having doping of opposite type to said doping of said semiconductor substrate, said deep well extending at once under said first, second, third and fourth semiconductor wells so as to insulate said first, second, third and fourth semiconductor wells from said semiconductor substrate, and applying said fourth back gate potential difference but not said third back gate potential difference.

* * * * *